(12) United States Patent
Swerts et al.

(10) Patent No.: US 10,325,710 B2
(45) Date of Patent: Jun. 18, 2019

(54) MAGNETORESISTIVE DEVICE COMPRISING CHROMIUM

(71) Applicant: IMEC VZW, Leuven (BE)

(72) Inventors: Johan Swerts, Kessel-Lo (BE); Sebastien Couet, Grez-Doiceau (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/860,478

(22) Filed: Jan. 2, 2018

(65) Prior Publication Data
US 2018/0190419 A1 Jul. 5, 2018

(30) Foreign Application Priority Data

Jan. 2, 2017 (EP) .................................. 17150036

(51) Int. Cl.
| | |
|---|---|
| *G11B 5/39* | (2006.01) |
| *H01F 10/30* | (2006.01) |
| *H01F 10/13* | (2006.01) |
| *H01F 10/32* | (2006.01) |
| *H01F 41/30* | (2006.01) |

(Continued)

(52) U.S. Cl.
CPC ........... *H01F 10/30* (2013.01); *G11B 5/3909* (2013.01); *H01F 10/138* (2013.01); *H01F 10/3254* (2013.01); *H01F 41/302* (2013.01); *H01F 41/325* (2013.01); *B82Y 10/00* (2013.01); *B82Y 25/00* (2013.01); *H01L 27/222* (2013.01)

(58) Field of Classification Search
None
See application file for complete search history.

(56) References Cited

U.S. PATENT DOCUMENTS

| | | | |
|---|---|---|---|
| 6,599,401 B1 * | 7/2003 | Wang .................... | B82Y 25/00 204/192.2 |
| 6,687,098 B1 * | 2/2004 | Huai ..................... | B82Y 10/00 360/324.12 |

(Continued)

OTHER PUBLICATIONS

Boukari et al., "Influence of Cr Capping on the Magnetic Properties of Epitaxial Co on Pd (111)", Thin Solid Films 318 (1998) pp. 177-179.

(Continued)

*Primary Examiner* — William J Klimowicz
(74) *Attorney, Agent, or Firm* — Knobbe, Martens, Olson & Bear LLP (57) ABSTRACT

The disclosed technology generally relates to a magnetoresistive device and more particularly to a magnetoresistive device comprising chromium. According to an aspect, a method of forming a magnetoresistive device comprises forming a magnetic tunnel junction (MTJ) structure over a substrate. The MTJ structure includes, in a bottom-up direction away from the substrate, a free layer, a tunnel barrier layer and a reference layer. The method additionally includes forming a pinning layer over the MTJ structure, wherein the pinning layer pins a magnetization direction of the reference layer. The method additionally includes forming capping layer comprising chromium (Cr) over the pinning layer. The method further includes annealing the capping layer under a condition sufficient to cause diffusion of Cr from the capping layer into at least the pinning layer. According to another aspect, a magnetoresistive device is formed according to the method.

15 Claims, 2 Drawing Sheets

(51) Int. Cl.
*H01F 41/32* (2006.01)
*B82Y 10/00* (2011.01)
*B82Y 25/00* (2011.01)
*H01L 27/22* (2006.01)

(56) References Cited

U.S. PATENT DOCUMENTS

| 6,729,014 | B2* | 5/2004 | Lin | B82Y 10/00 |
| | | | | 29/603.14 |
| 6,775,903 | B2* | 8/2004 | Horng | B82Y 10/00 |
| | | | | 29/603.07 |
| 6,972,934 | B2* | 12/2005 | Horng | B82Y 10/00 |
| | | | | 360/324.11 |
| 8,183,652 | B2* | 5/2012 | Ranjan | B82Y 10/00 |
| | | | | 257/421 |
| 2005/0018478 | A1 | 1/2005 | Nagase et al. | |
| 2007/0014149 | A1* | 1/2007 | Nagamine | H01L 43/08 |
| | | | | 365/158 |
| 2012/0280339 | A1 | 11/2012 | Zhang et al. | |

OTHER PUBLICATIONS

Devolder, Thibaut, "Evolution of Perpendicular Magnetized Tunnel Junctions Upon Annealing", Mar. 10, 2016; 5 pages.

Hallal et al., "Impurity Induced Enhancement of Perpendicular Magnetic Anisotropy in Fe/MgO Tunnel Junctions", Apr. 15, 2014; 6 pages.

Li et al., "High Post-Annealing Stability for Perpendicular $[Co/Ni]_n$ Multilayers by Preventing Interfacial Diffusion", Journal of Physics D: Applied Physics, Apr. 6, 2016; 5 pages.

Reith et al., "Effect of Very Thin Cr Films on the Magnetic Behavior of Epitaxial Co", Journal of Applied Physics 99 (2006); 4 pages.

* cited by examiner

MAGNETORESISTIVE DEVICE COMPRISING CHROMIUM

CROSS-REFERENCE TO RELATED APPLICATIONS

This application claims foreign priority to European Patent Application No. 17150036.6, filed Jan. 2, 2017, the content of which is incorporated by reference herein in its entirety.

BACKGROUND

Field

The disclosed technology generally relates to a magnetoresistive device and more particularly to a magnetoresistive device comprising chromium.

Description of the Related Technology

Magnetoresistive random access memory (MRAM) technology is a promising memory technology that can replace or improve various existing and future memory technologies, including volatile and nonvolatile memory technologies. Some magnetoresistive devices (e.g., MRAMs) or storage elements include a magnetic tunnel junction (MTJ) structure, which can enable relatively high speed switching and nonvolatility. Some MTJ structures in turn may be configured as a "top-pinned" MTJ structure. A top-pinned MTJ structure can include, in a bottom-up direction, a free layer, a reference layer arranged above the free layer and a tunnel barrier layer arranged between the free layer and the reference layer. The reference layer and the free layer are typically ferromagnetic layers formed to present a perpendicular magnetic anisotropy (PMA) or an in-plane magnetic anisotropy. The magnetization direction of the reference layer is "fixed" or "pinned," whereas the magnetization direction of the free layer is switchable. The pinning of the reference layer may be achieved by a hard magnetic "pinning" layer arranged above the reference layer.

Relative orientations of the magnetization directions of the reference layer and the free layer determine the electrical resistance of the MTJ. An MTJ may exhibit, e.g., a relatively low resistance when the magnetization directions of the reference layer and the free layer are aligned or parallel with respect to each other. On the other hand, the MTJ may exhibit a relatively high resistance when the magnetization directions of the reference layer and the free layer are anti-parallel with respect to each other.

The tunnel magneto-resistance ratio (TMR) is a measure of the difference in the MTJ electrical resistance between the anti-parallel state and the parallel state. The different states of the free layer, and accordingly the different resistance levels, may be used to represent either a logic "1" or a logic "0," or vice versa. A reading operation of the MTJ may be performed, e.g., by measuring a resistance of the MTJ to measure a read current that passes through the MTJ.

A writing operation of the MTJ generally involves changing/switching the magnetization direction of the free layer between the parallel and the anti-parallel states. In some MTJs, the free layer magnetization direction may be controlled by a spin-torque transfer (STT) effect, wherein the magnetization direction is changed by passing a relatively high write current (e.g., higher than the read current) through the MTJ, in a direction perpendicular to major surfaces of the layers forming the MTJ. In some other MTJs, the free layer magnetization direction may alternatively be controlled by a spin-orbit torque (SOT) effect, wherein the magnetization direction is changed by passing a current through an additional "SOT-generating layer" arranged adjacent to, e.g., above or below, the free layer. In yet some other MTJs, the STT-effect and the SOT-effect may be used in conjunction to enable faster switching of the magnetization direction of the free layer.

Despite the advantages, many MRAM technologies face fabrication challenges. The fabrication challenges includes achieving a sufficiently high TMR ratio (e.g., at least 150%), preferably at a low junction resistance area product (e.g., less than 10 Ohm*$\mu m^2$), and achieving a sufficient degree of magnetic anisotropy of the free layer and the reference layer. In addition, to enable high-performance devices, these properties should be present after exposure to elevated temperatures of fabricating the back-end-of-line (BEOL) (e.g., higher than 400° C.). In particular, for top pinned MTJs, this remains one of the key challenges to overcome.

SUMMARY OF CERTAIN INVENTIVE ASPECTS

An objective of the disclosed technology is to address these and other challenges.

According to a first aspect of the disclosed technology, a method of forming a magnetoresistive device comprises: forming, above a substrate, a magnetic tunnel junction structure including in a bottom-up direction a free layer, a tunnel barrier layer and a reference layer, forming a pinning layer, above the magnetic tunnel junction structure, for pinning a magnetization direction of the reference layer, forming a Cr-including capping layer above the pinning layer, and performing an anneal step wherein Cr diffuses from the capping layer into at least the pinning layer.

According to a second aspect of the disclosed technology, a method of forming a magnetoresistive device comprises: forming, above a substrate, a magnetic tunnel junction structure including in a bottom-up direction a free layer, a tunnel barrier layer and a reference layer, forming at least one sublayer of a pinning layer, above the magnetic tunnel junction structure, the pinning layer for pinning a magnetization direction of the reference layer, forming a Cr-including capping layer above said at least one sublayer of the pinning layer, and performing an anneal step wherein Cr diffuses from the capping layer into at least said at least one sublayer of the pinning layer.

As realized by the inventors, a magnetoresistive device based on a top-pinned magnetic tunnel junction (MTJ) may show degradation of the TMR if subjected to typical BEOL-temperatures (e.g., 400° C.). The inventors attribute the degradation mainly to an anisotropy loss of the reference layer system, formed by the reference layer and the pinning layer (and a spacer layer if present).

The Cr-including capping layer may be formed above the pinning layer. The capping layer may thus form a capping layer with respect to the full pinning layer and the MTJ. Alternatively, the Cr-including capping layer may be formed as a sublayer of the pinning layer. The capping layer may thus form a capping layer with respect to the at least one sublayers of the pinning layer below the capping layer and the MTJ. Introducing the Cr-including capping layer and triggering, by an anneal step, diffusion of the Cr enables a significant improvement of the thermal robustness of the MTJ structure and thus also of the magnetoresistive device. The magnetic anisotropy and magnetic coercivity of the reference layer and the pinning layer, as well as the TMR of the MTJ and the resulting device may also be improved.

When reference layer anisotropy fails during high thermal budget processing, the TMR will also be reduced and resistance area (RA) will increase. Accordingly, by improving the anisotropy of the reference layer system, the TMR/RA ratio is maintained during high thermal budget processing.

Introducing the Cr into the pinning layer by diffusion from the capping layer allows Cr to be introduced in a controlled manner.

An advantage of the first method aspect is that the Cr is introduced post the pinning layer formation. The process of forming the pinning layer may accordingly be formed without the risk of Cr detrimentally impacting the texture of the pinning layer needed to provide the desired magnetic anisotropy of the pinning layer.

An advantage of the second method aspect is that the Cr-including capping layer may be introduced within the pinning layer, at a position or level within the pinning layer where the capping layer may provide a greatest benefit. It may further facilitate diffusion of Cr lower or deeper into the below layers of the layer stack, in particular the reference layer.

An embodiment of the second method aspect may accordingly include: forming said at least one sub-layer of the pinning layer above the magnetic tunnel junction structure, forming the Cr-including capping layer above said at least one sublayer of the pinning layer, performing said anneal step wherein Cr diffuse from the capping layer into at least said at least one sublayer of the pinning layer, and forming, above the capping layer and subsequent to said anneal step, at least one additional sublayer of the pinning layer.

The at least one additional sublayer of the pinning layer may further improve the total magnetic moment of the pinning layer.

A magnetoresistive device according to the disclosed technology is suitable for use in a magnetoresistive random access memory (MRAM). The magnetoresistive device may accordingly form a magnetoresistive memory device. A magnetoresistive device according to the disclosed technology may, however, also be usable as a magnetoresistive spin logic device, enabling implementation of typical Boolean logic operations.

As used herein, the term "bottom-up direction" refers to the order of the layers forming part of the device, i.e. the layer stack, in relation to the substrate. The terminology "bottom-up direction" does hence not refer to an absolute orientation of the layers but to a relative ordering or a sequence of the layers forming the device and the MTJ structure, or the sequence in which the layers are formed.

Similarly, one layer being arranged or formed "above" another layer is used to define that said one layer is arranged at a level above said other layer as seen in a direction from the substrate. Said one layer is accordingly arranged farther away from the substrate than said other layer.

One layer may be arranged "on" another layer by being arranged directly on, i.e. above and in contact with, said other layer. One layer may also be arranged "on" another layer by being arranged on said other layer with one or more intermediate layers present in between.

In the following, when reference is made to a sublayer of a layer having a multilayer structure (for instance a free layer, a reference layer or a pinning layer having at least two sublayers of different properties, type, or material), the prefix "sub" in "sublayer" may be omitted for brevity.

The free layer is a layer having a (net) magnetization which may be varied. That is, the direction of the magnetization vectors or magnetic moments of the free layer may be varied. The direction of the magnetization of the free layer may be varied between two states, a "parallel" state wherein the magnetization direction of the free layer is parallel to the magnetization direction of the reference layer and an "anti-parallel" state wherein the magnetization direction of the free layer is anti-parallel to the magnetization direction of the reference layer. The free layer may also be referred to as a storage layer.

The reference layer is a layer having a (net) magnetization which is fixed or pinned. That is, the direction of the magnetization vectors or magnetic moments of the reference layer is fixed or pinned. The reference layer may also be referred to as the fixed layer or the pinned layer.

The free layer may be a ferromagnetic layer. The reference layer may be a ferromagnetic layer. The free layer may be a soft magnetic layer. The reference layer may be a hard magnetic layer. The denominations "soft" and "hard" may here be understood as the free layer being arranged or formed to present a (magnetic) coercivity which is less than a coercivity of the reference layer.

The pinning layer is adapted to fix or pin the magnetization direction of the reference layer. By the pinning effect exerted on the reference layer by the pinning layer, the coercivity of the reference layer may be increased compared to the free layer. The pinning layer may as will be further described below be a hard ferromagnetic layer or configured as an antiferromagnetic layer.

The tunnel barrier layer is arranged between the reference layer and the free layer. The tunnel barrier layer is a non-ferromagnetic and electrically insulating layer. The tunnel barrier layer is adapted to allow a tunneling current across the tunnel barrier layer.

According to one embodiment, the anneal step is adapted to cause Cr to diffuse from the capping layer into the reference layer. By causing the Cr to diffuse into also the reference layer, the aforementioned performance-related properties of the MTJ structure, and the thermal robustness of the device may be further improved.

According to one embodiment, the anneal step is adapted to cause both Cr to diffuse from the capping layer, and the reference layer and the free layer to crystallize. Accordingly, a single anneal step may be performed after the MTJ, the pinning layer and the capping layer have been formed for causing the diffusion of Cr and the crystallization of the reference and free layers. The thermal energy provided by the anneal step may trigger and drive the crystallization of the free layer and the reference layer and also trigger and drive the diffusion of Cr into at least the pinning layer. The virtues of the method may thereby be obtained with a minimum of additional process steps.

By the crystallization the magnetic anisotropy of the free layer and the reference layer may be increased.

"Crystallization" of the free layer and the reference layer hereby refers to the transfer of the texture or crystal structure of the tunnel barrier layer to the free layer and the reference layer. The crystallization may be complete or partial. That is, a least a thickness portion of the free layer and the reference layer, respectively, which is adjacent to the tunnel barrier layer may be crystallized.

The afore-mentioned anneal step may include subjecting the magnetic tunnel junction structure, the pinning layer and the capping layer to an ambient temperature of at least 250° C. An amount of thermal energy sufficient for driving both the crystallization and the Cr diffusion may thereby be provided to the layers. Advantageously, the ambient temperature does not exceed 450° C., or does not exceed 400° C. The anneal step may accordingly be thermally compatible with any BEOL portions already present on the substrate when the anneal step is performed (for instance formed below the MTJ structure).

According to one embodiment, the method further comprises, subsequent to forming the free layer (and optionally the tunnel barrier layer) and before forming the reference layer, performing an anneal step adapted to cause the free layer of the magnetic tunnel junction structure to crystallize. According to an alternative embodiment, the method further comprises, subsequent to forming the reference layer and before forming the pinning layer or at least one sublayer of the pinning layer, performing an anneal step adapted to cause the reference layer and the free layer of the magnetic tunnel junction structure to crystallize. According to both of the aforementioned alternative embodiments, a "first" anneal step causing the crystallization of the free layer and/or reference layer may be performed before the pinning layer is formed. This may facilitate formation of a high quality MTJ and avoid a presence of the pinning layer (and presence of the reference layer in case the anneal step is performed before the reference layer is formed) interfering with the crystallization. The afore-mentioned anneal step causing the Cr diffusion (which hence may be referred to as a "second" or "further" anneal step) may be performed after forming the capping layer, the second anneal step being adapted to cause Cr to diffuse from the capping layer into at least the pinning layer.

The first anneal step may include subjecting the free layer and/or the reference layer to an ambient temperature of at least 250° C.

The second anneal step may include subjecting the magnetic tunnel junction structure, the pinning layer and the capping layer to an ambient temperature of at least 250° C.

Advantageously, the ambient temperature during the first and the second anneal step does not exceed 450° C., or does not exceed 400° C. The anneal step(s) may accordingly be thermally compatible with any BEOL portions already present on the substrate when the anneal step is performed (for instance formed below the MTJ structure).

It should also be understood that, in case the tunnel barrier layer not is completely crystallized prior to being subjected to an anneal step, also the tunnel barrier layer may be crystallized during the anneal step. The particulars of the crystallization process may differ depending on material systems. However, typically the tunnel barrier layer may first crystallize and thereafter the free layer (and the reference layer if present) may crystallize in accordance with the texture of the crystallized tunnel barrier layer.

As will be further described below, the pinning layer may be formed by a stack of sublayers, in which case "before forming the pinning layer" should be understood as before forming at least a first sublayer of the pinning layer, or at least before forming a last/top-most sub-layer of the pinning layer.

The capping layer may include one or more monolayers of Cr. The capping layer may also include a combination of Cr and at least a second element. The combination may be an alloy of Cr and said at least second (metal) element. A resistance of the capping layer may thereby be limited. The layer may be a non-magnetic alloy layer, e.g., a layer with zero, or substantially zero, net magnetization. Advantageously, a total thickness of the capping layer may be in the range of 0.2 nm to 5 nm. An amount of Cr sufficient for achieving the above described improvements may thereby be provided without unduly increasing the height of the layer stack or device.

The capping layer may include a repetitive sequence of a Cr-layer and a layer of a second element. The second element may be a metal. The layer may be a non-magnetic layer, i.e. a layer with zero, or substantially zero, net magnetization.

The method may further comprise forming a top electrode above the capping layer. The top electrode may include Ru. The top electrode may be a Ru-layer or a layer of $RuO_2$. A top electrode including Ru may promote a "downward" diffusion of the Cr. A thickness of the top electrode may advantageously be at least 1 nm to provide a reliable amount of diffusion barrier function. The Ru-layer may advantageously be formed directly on top of the capping layer.

The method may further comprise forming a bottom electrode, wherein the magnetic tunnel junction structure is formed above the bottom electrode.

The bottom electrode may be formed by a bottom electrode layer.

The pinning layer or the at least one sublayer of the pinning layer may include a hard magnetic layer. The (magnetic) coercivity of a hard magnetic enables a reliable pinning of the magnetization direction of the reference layer.

The pinning layer may be a ferromagnetic pinning layer or include a ferromagnetic sublayer. Coupling a ferromagnetic layer to the reference layer enables a reliable pinning of the reference layer. Especially, the pinning layer and the reference layer may be coupled through an intermediate spacer layer, adapted to provide a parallel coupling of magnetic moments of the reference layer and the pinning layer. The intermediate spacer layer may be a Ta- or W-including layer. A ferromagnetic layer may include a Co- and/or Fe-including layer.

The pinning layer may be arranged as a synthetic antiferromagnetic (SAF) structure. The aforementioned at least one sublayer of the pinning layer may be sublayers which together with higher sublayers of the pinning layer form or act as a SAF. Coupling a SAF (structure) to the reference layer enables a reliable pinning of the reference layer. Especially, the SAF and the reference layer may be coupled through an intermediate spacer layer, adapted to provide a parallel coupling of magnetic moments of the reference layer and the pinning layer. The intermediate spacer layer may be a Ta- or W-including layer.

The SAF may include two (sub-)layers of ferromagnetic material layers coupled through a spacer (sub-)layer of the SAF. The spacer layer of the SAF may be adapted to provide an anti-parallel coupling of magnetic moments of the two ferromagnetic material layers. One or both of the two ferromagnetic layers of the SAF may include a Co- and/or Fe-including layer.

According to one embodiment the free layer and the reference layer each includes a CoFeB-layer. These material combinations enable forming of an MTJ with desirable properties and a reliable pinning of the reference layer. Diffusion of Cr into such a reference layer may change the properties of the reference layer in a manner enabling improved TMR and thermal robustness.

According to one embodiment, the method further comprises forming a spacer layer on the reference layer and thereafter forming the pinning layer, or said at least one sublayer of the pinning layer, on the spacer layer. An intermediate spacer layer enables coupling of the moments of the magnetic moment of the reference layer and magnetic moments of the pinning layer. The spacer layer may be adapted to provide a parallel coupling of magnetic moments of the reference layer and the pinning layer. This spacer layer accordingly forms a spacer layer with respect to/between the reference layer and the pinning layer. The spacer layer may hence be referred to as a reference-pinning spacer layer. The intermediate spacer layer may be a Ta- or W-including layer.

The method may further comprise, forming the stack of layers including the free layer, the tunnel barrier layer and the reference layer, the pinning layer and the capping layer, and subsequently patterning the stack of layers to obtain a pillar structure including said stack of layers. The act of patterning of the layer stack may include forming a mask above the layer stack and etching regions of the layer stack exposed by the mask, thereby forming one or more pillars.

According to a third aspect there is provided a magnetoresistive device, comprising: a magnetic tunnel junction structure arranged above a substrate and including in a bottom-up direction a free layer, a tunnel barrier layer and a reference layer, and a pinning layer arranged above the reference layer and adapted to pin a magnetization direction of the reference layer, wherein at least the pinning layer includes Cr.

The advantages discussed in connection with the first and second method aspect apply correspondingly to the third device aspect. Reference is therefore made to the above discussion. In particular, the presence of Cr in the pinning layer enables the improved device properties as discussed above.

At least the pinning layer may include Cr. Advantageously, also the reference layer of the magnetic tunnel junction structure includes Cr.

The pinning layer, and optionally also the reference layer, may include a Cr-including alloy.

The pinning layer, and optionally also the reference layer, may include diffused Cr.

The pinning layer may include an amount of Cr which decreases in a downward direction of the device.

The device may further comprise a Cr-including capping layer arranged above the pinning layer or as a sublayer of the pinning layer. The pinning layer (or the portions/sublayers of the pinning layer) arranged below the Cr-including capping layer may include an amount of Cr which decreases in a downward direction of the device.

The device may further comprise a spacer layer arranged between the reference layer and the pinning layer.

The spacer layer may be a Ta- or W-including layer.

The device may further comprise a top electrode layer arranged above the capping layer. The top electrode layer may include a Ru-layer.

The device may further comprise a bottom electrode arranged below the MTJ structure.

The further details and discussions in connection with the first method aspect apply correspondingly to the second device aspect and will therefore not be repeated here.

According to a fourth aspect there is provided a magnetoresistive random access memory, MRAM, including a plurality of devices in accordance with the third device aspect, or any of the embodiments or variations thereof.

BRIEF DESCRIPTION OF THE DRAWINGS

The above, as well as additional objects, features and advantages of the disclosed technology, will be better understood through the following illustrative and non-limiting detailed description of preferred embodiments of the disclosed technology, with reference to the appended drawings. In the drawings like reference numerals will be used for like elements unless stated otherwise.

DETAILED DESCRIPTION OF CERTAIN ILLUSTRATIVE EMBODIMENTS

A method of forming a magnetoresistive device for an MRAM will now be described with reference to FIG. 1a through 1b wherein a stacked structure is shown at different stages of the method. The structure is shown in a cross-section taken through the stacking direction of the layers. It should be noted that the layers may extend laterally/horizontally beyond the illustrated portions. It should also be noted that for the purpose of clarity the various layers and other features of the stacks are not drawn to scale and their relative dimensions, in particular their thickness, may differ from a physical stack. Typically, unless stated otherwise in the following, each of the layers of the stack may be formed with a thickness of a few Å to a few tens of Å.

Figure 1A:
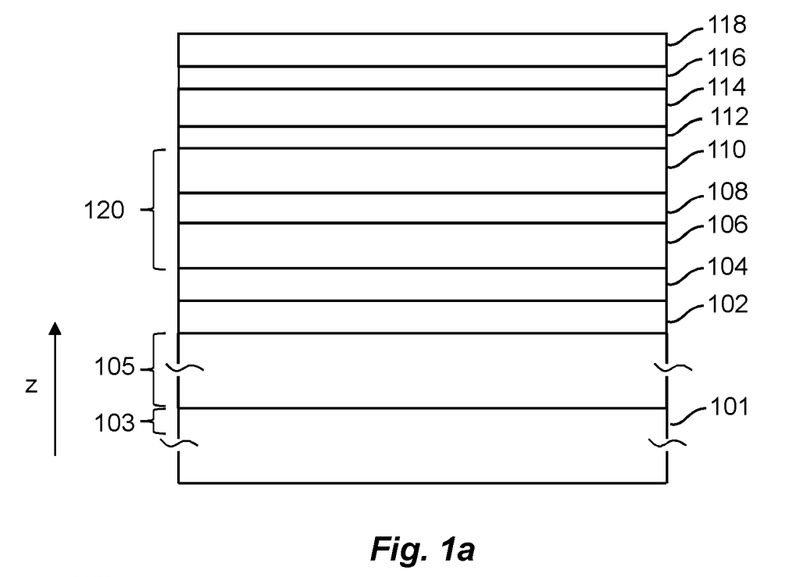
FIGS. 1a and 1b schematically illustrate intermediate structures at different stages of fabricating a magnetoresistive device for an MRAM, according to embodiments

FIG. 1a shows an intermediate structure during fabrication of a magneto resistive device, according to embodiments. The intermediate structure includes a stack of layers 102-108 formed above a substrate 101. The substrate 101 may be a semiconductor substrate. Examples of semiconductor substrates include a Si substrate, a Ge substrate, a SiGe substrate, a SiC substrate, a SOI substrate, a GeOI substrate, a SiGeOI substrate to name a few.

As shown, the structure may optionally include a front-end-of-the-line (FEOL) portion 103 and a back-end-of-the-line (BEOL) portion 105. The FEOL-portion 103 may include, e.g., active devices formed in a semiconductor layer of the substrate 101. The devices may form logic circuit devices. The devices may include switches used for reading and writing of the MTJs which are to be formed. The devices may include for instance metal-oxide-semiconductor field effect transistors (MOSFETs), metal-insulator-semiconductor field effect transistors (MISFETs), bipolar junction transistors (BJTs), homojunction bipolar transistors (JBTs), fin field effect transistors (FinFETs) and nanowire FETs to name a few. The devices may be formed using conventional FEOL-processing.

The BEOL-portion 105 may include a number of metallization layers separated by interlayer dielectrics. An interlayer dielectric may also be formed on top of the FEOL-portion 103 for insulating the devices from the lower level metallization layer. Metallization layers may for instance be formed by Cu, W, Au, Ag, Al, Co or Ru. Interlayer dielectrics may for instance be formed by silicon oxide, silicon oxide nitride, silicon carbide nitride or silicon nitride. The BEOL-portion 105 may include vias interconnecting metallization layers. Vias may for instance be formed by Cu, W, Au, Ag, Al, Co, Ni, Ru or by a highly doped semiconductor material. One or more of the metallization layers may define bit lines and word lines for the array of the memory cells which are to be formed. The metallization layers may together with the active devices of the FEOL-portion 103 define logic circuitry for controlling reading and writing operations and for driving bit lines and word lines. The BEOL-portion may be formed using conventional BEOL-processing. As will be further described BEOL-processing may alternatively or additionally be performed after forming of the device.

A bottom electrode layer 102 is formed above on the substrate 101. The bottom electrode layer 102 may be formed of Ta, Ti, TaN, TiN, or combinations thereof. The bottom electrode layer 102 may also be formed of another conductive material, for instance of Cu. The bottom electrode layer 102 may be formed in for instance a sputtering or evaporation process.

The bottom electrode layer 102 may be formed on and in contact with a metal line of the BEOL-portion 105. The bottom electrode layer 102 may also be formed on and in contact with a via which in turn is connected to a metal line of the BEOL-portion 105

One or more interlayers 104 may be formed on the bottom electrode layer 102. The interlayer(s) 104 may include a metal underlayer of for instance Ru. The interlayer(s) 104 may include a seed layer including one or more sub-layers of different materials which are known for promoting the anisotropy of the free layer 106, described below. The interlayer(s) 104 may include a spin-orbit torque (SOT)-generating layer. Each of the interlayer(s) may be formed in for instance a respective sputtering or evaporation process.

A magnetic tunnel junction (MTJ) structure 120 is formed above the substrate 101. Forming the MTJ structure 120 includes forming in a bottom-up direction (indicated by "z" in FIG. 1a) a free layer 106, a tunnel barrier layer 108 and a reference layer 110. The process of forming each of the layers of the MTJ structure 120 may include deposition by sputtering.

The free layer 106 may be formed on the bottom electrode 102 or on the interlayer(s) 104 if present. The free layer 106 may be formed by a ferromagnetic material. Examples of ferromagnetic materials for the free layer 106 include Fe, Co, FeB, CoB, CoFe and CoFeB. The free layer 206 may also have a multi-layer structure including combinations of the afore-mentioned materials. The free layer 106 may further include sub-layers of non-ferromagnetic materials. By way of example the free layer may include a stack of a CoFeB-layer, a metal-layer and a Co—FeB-layer. The metal-layer may advantageously be formed of same material as the spacer layer 112, to be described below. The stack may be formed on an MgO seed layer.

The tunnel barrier layer 108 is formed on the free layer 106. The tunnel barrier layer 108 may include a layer of a dielectric material, for instance MgO, $AlO_x$, $MgAlO_x$ or $MgTiO_x$.

The MTJ structure 120 may also include dual-tunnel barrier layer configuration. Accordingly, the MTJ structure 120 may include in a bottom-up direction a first free layer portion, a first tunnel barrier layer, a second free layer portion and a second tunnel barrier layer. This configuration may be extended beyond two tunnel barrier layer configurations.

The reference layer 110 is formed on the tunnel barrier layer 108. The reference layer may be formed by a ferromagnetic material. Examples of ferromagnetic materials for the reference layer 110 include Fe, Co, FeB, CoB, CoFe and CoFeB. The reference layer 110 may also have a multi-layer structure including combinations of the afore-mentioned materials.

As will be further described below, the MTJ structure 120 may be subjected to an anneal step wherein the tunnel barrier layer 108 may act as a template and transfer its texture (for instance [001] of MgO) to the reference layer 110 and the free layer 106. Thereby, at least the thickness portions of the free layer 106 and the reference layer 110 closest to the tunnel barrier layer 108 may be crystallized in accordance with the texture of the tunnel barrier layer 108.

As is known to the person skilled in the art, the crystallization of the free layer 106 and the reference layer 110 induces a magnetic anisotropy, or increases the degree of magnetic anisotropy, in the free layer 106 and the reference layer 110. Depending on the material systems and configurations used, the free layer 106 and the reference layer 110 may be provided with an in-plane magnetic anisotropy or a perpendicular magnetic anisotropy (PMA).

A pinning layer 114 is formed above the MTJ structure 120. The pinning layer 114 is a fixing or pinning layer with respect to the reference layer 110. The pinning layer 114 is accordingly arranged to pin a magnetization direction of the reference layer. In case of an MTJ structure with PMA the pinning layer 114 may also be formed to present PMA.

A spacer layer 112 may be formed on the reference layer 110 before forming of the pinning layer 114. The pinning layer 114 and the reference layer 110 may accordingly be coupled through the spacer layer 112. The spacer layer 114 may be formed by a layer of Ta, W, Mo, V, Bi, Pt, Hf or combinations thereof or a layer of CoFeBX, CoFeX, FeX, CoX, where X=W, Ta, Mo, Pt, Hf, V, Bi.

The pinning layer 114 may include a number of sublayers. The pinning layer 114 may include a hard magnetic layer. The pinning layer 114 may be a ferromagnetic pinning layer. A ferromagnetic pinning layer may include a Co-layer, an Fe-layer or a CoFe-layer. A ferromagnetic pinning layer may include a combination of a Co-, Fe- or CoFe-layer and a Pt-, Pd-, Ni-, Tb- or Gd-layer. Such combinations may be stacked on top of each other a number of times to form a repetitive sequence, above a Co-, Fe or CoFe-layer of the ferromagnetic pinning layer. A ferromagnetic pinning layer may include an alloy of Co, Fe or CoFe and Pt, Pd, Ni, Tb or Gd. The pinning layer 114 may be formed by a SAF structure. A SAF structure pinning layer 114 may be formed by two ferromagnetic layers and an intermediate (SAF) spacer layer. Each of the two ferromagnetic layers of the SAF may be formed in a same manner as the above described ferromagnetic pinning layer. The spacer layer of the SAF may include, or be formed by, a Ru-layer, an Ir-layer or a Rh-layer.

With reference to FIG. 1a, a Cr-including capping layer 116 comprising Cr is formed above the pinning layer 114. In some embodiments, the Cr-including capping layer 116 may be formed directly on a top surface of the pinning layer 114.

The capping layer 116 may include one or more monolayers of Cr. A total thickness of the one or more monolayers of Cr may be in the range of about 2 Å to about 5 nm. The capping layer 116 may be formed essentially of Cr, according to some embodiments. The capping layer 116 may alternatively be an alloy of Cr and a second element selected from the group consisting of: Ni, Ta, Pt, Pd, Tb, Gd, W, Mo, Ru, Bi, Hf, Fe, Co, Ti, V. The capping layer 114 may be formed by sputtering or evaporation processes.

In some embodiments, the capping layer may include a repeating sequence of a first a sub-layer (formed by one or more monolayers of Cr) alternating with a second sub-layer (formed by a one or more monolayers of a second element). The capping layer 114 may for instance include a combination of a 1.75 Å sub-layer (formed by a number of monolayers of Cr) and a 1.75 Å sub-layer (formed by a number of monolayers of the second element). The sequence may be repeated a number of times, for instance 6. The total thickness of the capping layer should preferably not exceed 5 nm. Thereby a height of the device above the substrate may be limited. The second element may be selected from the group consisting of: Ni, Ta, Pt, Pd, Tb, Gd, W, Mo, Ru, Bi, Hf, Fe, Co, Ti, V. A capping layer of alternating nanolaminates of Cr and a second element may hence be formed. By way of example, the capping layer 116 may include an amount of Cr per area unit which is equivalent to an amount of Cr per area of a typical 0.2 nm-5 nm bulk Cr-film.

In a variation, the capping layer 116 may instead be formed as a sublayer of the pinning layer. The capping layer 116 may be formed between any two of the abovementioned sublayers of the pinning layer 114.

A top electrode 118 is formed above the capping layer 116. The top electrode 118 may be formed as a top electrode layer 118 on the capping layer 116. If the capping layer 116 is formed as a sublayer of the pinning layer 114, the top electrode 118 may be formed on the pinning layer 114. The top electrode 118 may be formed by a Ru-layer. The top electrode 118 may be formed with a thickness of at least 1 nm. The top electrode 118 may be formed in for instance a sputtering or evaporation process.

In accordance with the method, the stack of layers shown in FIG. 1a is subjected to an anneal step. The annealing may include subjecting the stack of layers to a temperature in the range of 250° C. to 450° C. The temperature here refers to an ambient temperature in a reactor or furnace.

The anneal will cause Cr of the capping layer 116 to diffuse from the capping layer 116 into lower parts or sublayers of at least the pinning layer 114. Depending on the temperature and the duration of the anneal Cr may diffuse further down in the layer stack, for instance to the spacer layer 112 and even into at least an upper thickness portion of the reference layer 110. As discussed above, the diffused Cr provide performance-related advantages of the device, and the thermal robustness of the device may be further improved. The anneal step may also trigger the crystallization of the free layer 106 and the reference layer 110.

It will be appreciated that, because Cr in the lower layers below the capping layer 116, e.g., the pinning layer 114, originates from the capping layer 116 by atomic diffusion, the concentration of Cr in the lower layers below the capping layer 116 is about the same or lower than the concentration of Cr in the capping layer. In addition, the concentration profile(s) of Cr in the lower layers have diffusion concentration profile(s) characteristic of atomic diffusion under a concentration gradient. Such diffusion concentration profile may be different from concentration profiles that may result when the lower layers are directly formed to contain Cr.

Alternatively, a first anneal step causing the crystallization of the reference layer 110, the tunnel barrier layer 108 and the free layer 106 may be performed after or prior to forming the spacer layer 112, and before forming the pinning layer 114. The first anneal step may include subjecting the MTJ structure 120 to a (ambient) temperature in the range of 250° C. to 450° C. A further anneal step may then be performed after forming the capping layer 116 for causing the diffusion of Cr from the capping layer 116. According to a further alternative, a first anneal step causing the crystallization of the free layer 106 and the tunnel barrier layer 108 may be performed before forming the reference layer 110. The reference layer 110 may in this case subsequent to the first anneal step be formed on the already crystallized tunnel barrier layer 108.

Figure 1B:
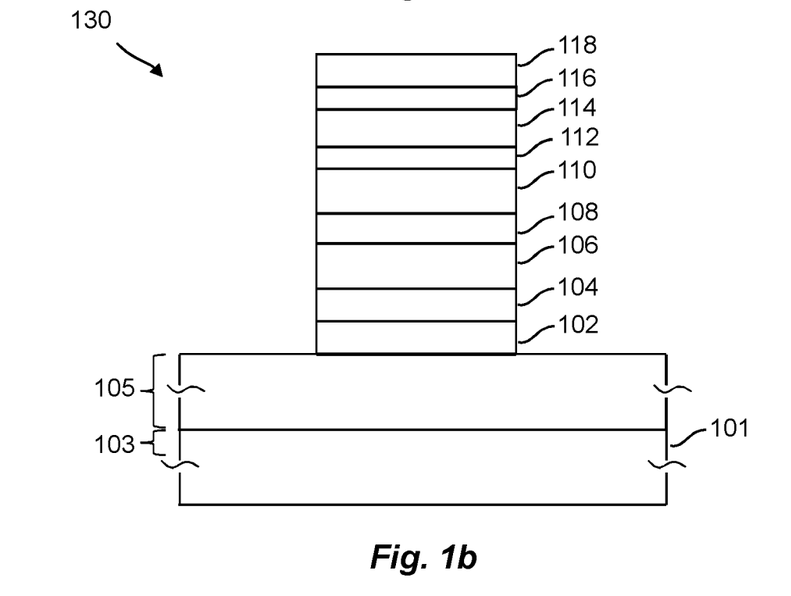

As shown in FIG. 1b, the method may further comprise patterning the stack of layers shown in FIG. 1a to form a pillar structure 130 including the MTJ structure 120, the pinning layer 114, the capping layer 116 etc. The pillar structure 130 forms a magnetoresistive device which may be used in for instance an MRAM.

A mask may be formed above the layer stack shown in FIG. 1a. The mask may be formed by silicon oxide, silicon oxide nitride, silicon carbide nitride or silicon nitride The mask may be a hard mask. Examples of hard mask materials include Ta, TiN, TaN, TiTaN and spin-on-carbon/spin-on-glass materials. A mask layer may be deposited above the layer stack. The mask may be defined by patterning a photo resist formed on the mask layer and transferring the pattern of the photo resist to the mask layer by etching. The mask may for instance be patterned to a rectangular shape, an oval shape or a circular shape, as viewed in a top-down direction.

The pattern of the mask may be transferred to the layer stack by etching regions of the layer stack which are exposed by the mask. The layer stack may be patterned using in an anisotropic etch process such as a reactive-ion-etching (RIE) process or an ion-beam-etching (IBE) process. The layer stack may be etched until the pattern has been transferred to at least the free layer 106, for instance even to the lowermost layer of the layer stack (which in FIG. 1b is formed by the bottom electrode layer 102). It should be noted that more than one such pillar structure 130 may be formed by forming a mask including one mask portion for each pillar to be formed.

In FIGS. 1a and 1b, the capping layer 116 is shown to be present also subsequent to the anneal step causing the diffusion. However, by forming a capping layer 116 of a reduced thickness and/or increasing the duration of the anneal step, the Cr of the capping layer 116 may diffuse completely such that no capping layer 116 remains above the pinning layer 114 after the anneal step (if the capping layer 116 is formed by Cr) or such that the capping layer 116 includes no, or substantially no, Cr after the anneal step (if the capping layer 116 is formed by Cr and at least a second element). Hence, a post-annealing layer stack or pillar structure, and accordingly the resulting magnetoresistive device, need not include a Cr-including capping layer 116. Still, diffused Cr will be present in at least the pinning layer 114, as described above.

Subsequent to forming the pillar structure 130, conventional BEOL-processing may be performed to integrate the magnetoresistive device in a functional circuit. For instance, one or more dielectric layers (such as a silicon oxide) may be deposited over the structure 130. Metal lines and vias connecting to the top electrode 118 may be formed in the dielectric layer. Metal lines and vias may for instance be formed in a dual damascene process. By virtue of the diffusion of Cr into the pinning layer 114 and possibly also the reference layer 110, the loss of TMR and magnetic anisotropy in the pinning layer 114 and the reference layer 110, due to the elevated temperatures during the BEOL-processing, may be avoided. It may be understood that some diffusion of Cr from the capping layer 116 also may occur during the BEOL-processing.

Figure 2A:
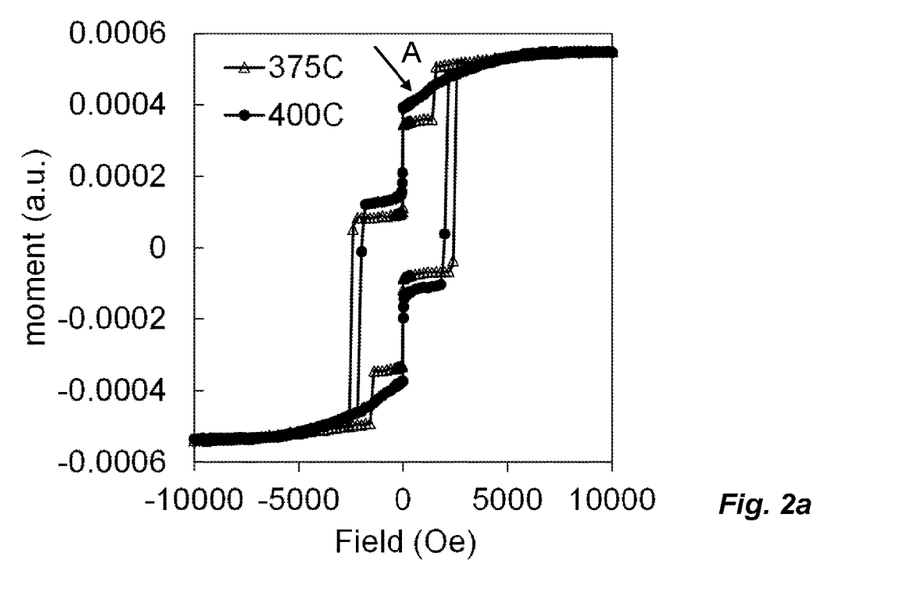
FIGS. 2a and 2b illustrate experimental measurements of magnetic moment performed on experimental stacks without a Cr-including capping layer and with a Cr-including capping layer, according to embodiments, respectively.
Figure 2B:
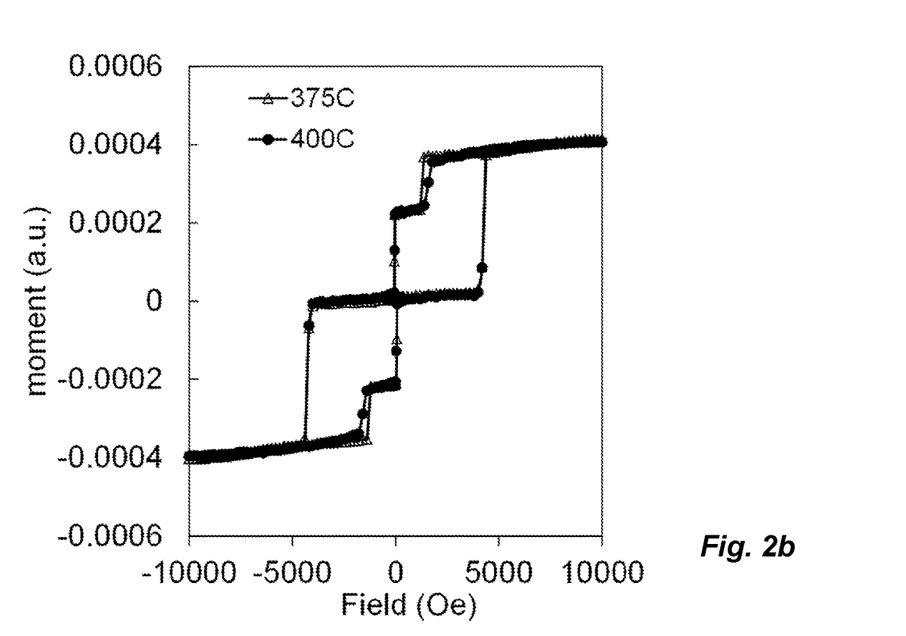

FIGS. 2a and 2b illustrate measurements performed on an experimental stack without a Cr-including capping layer and with a Cr-including capping layer, respectively. The plots illustrate the magnetic moment of the stack as a function of the magnetic field applied perpendicular to the substrate, subsequent to a 30 minute anneal at 375° C. (triangles) and 400° C. (circles).

The experimental stack included in a bottom-up direction: CoFeB/Mg/Ta/CoFeB (free layer), MgO 10 Å (tunnel barrier layer), CoFeB 13 Å (reference layer), a Ta 4 Å (spacer layer) and a pinning layer including in a bottom-up direction Co 12 Å, Ru 8.5 Å, Co 6 Å, Pt 8 Å, and a Co 3 Å/Pt 8 Å stack repeated 8 times (FIG. 2a) or 6 times (FIG. 2b).

In FIG. 2b a 2.1 nm capping layer formed by a Cr 1.75 Å/Ni 1.75 Å stack repeated 6 times was formed on the pinning layer.

As indicated by arrow A in FIG. 2a, there is a loss of PMA in the reference layer following the 400° C. anneal. As may be seen in FIG. 2b however, the PMA of the reference layer is maintained.

The device may be used in an MRAM, or in a spin logic circuit, wherein the magnetization direction is switched by an external magnetic field generated by currents flowing in vicinity of the device. The device may advantageously be used in conjunction with STT-type switching, wherein the magnetization direction of the free layer 106 is switched using the STT-effect as described above. Optionally, a layer stack or pillar structure similar to the stack and structure shown in FIGS. 1a and 1b may be formed to further include a spin-orbit-torque (SOT)-generating layer below the free layer 106, arranged to allow conduction of a current along or parallel to the free layer 106 and exert a spin-orbit torque on the magnetization direction of the free layer 106. The magnetization direction of the free layer 106 may thereby be switched using the SOT-effect as described above. A SOT-generating layer may be formed by a metal layer of a thickness of one to a few nanometers or a similarly thin layer of a topological insulator. Such a device may thus be used in a spin logic circuit or an MRAM of an SOT-type. The device may also be used in a device or circuit wherein the STT and SOT-effect may be used in conjunction to enable faster switching of the magnetization direction of the free layer 106.

In the above the inventive concept has mainly been described with reference to a limited number of examples. However, as is readily appreciated by a person skilled in the art, other examples than the ones disclosed above are equally possible within the scope of the inventive concept, as defined by the appended claims.

For instance, instead of patterning the layer stack shown in FIG. 1a after the one or more anneal steps, the patterning may be performed before the anneal steps. Hence, Cr may diffuse from the (patterned) capping layer 116 into lower layers of the pillar structure 130.

Moreover, the layer stack need not include a bottom electrode layer 102 as shown in FIG. 1a. Instead, a bottom electrode may be provided in the form of a via interconnecting the free layer 106 (or the interlayer(s) 104 if present) with a metal line in a metallization layer of the BEOL-portion 105. The metal line may form a bit line or word line. As a further alternative, a bottom electrode may be provided in the form of a metal line (forming e.g., bit line or a word line) of a metallization layer of the BEOL-portion 205.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A method of forming a magnetoresistive device, the method comprising:
   forming a magnetic tunnel junction (MTJ) structure over a substrate, the MTJ structure including, in a bottom-up direction away from the substrate, a free layer, a tunnel barrier layer and a reference layer;
   forming a pinning layer over the MTJ structure, wherein the pinning layer pins a magnetization direction of the reference layer;
   forming a capping layer comprising chromium (Cr) over the pinning layer; and
   annealing the capping layer under a condition sufficient to cause diffusion of Cr from the capping layer into at least the pinning layer.

2. The method according to claim 1, wherein the condition is sufficient to cause diffusion of Cr further into the reference layer.

3. The method according to claim 1, wherein the condition is sufficient to cause the reference layer and the free layer to crystallize.

4. The method according to claim 1, wherein annealing includes subjecting the MTJ structure, the pinning layer and the capping layer to an ambient temperature of at least 250° C.

5. The method according to claim 1, further comprising, subsequent to forming the free layer and before forming the reference layer, annealing to cause the free layer to crystallize.

6. The method according to claim 1, further comprising, subsequent to forming the reference layer and before forming the pinning layer, annealing to cause the reference layer to crystallize.

7. The method according to claim 1, wherein the capping layer includes one or more monolayers of Cr, or a combination of one or more monolayers of Cr and one or more monolayers of a second element.

8. The method according to claim 1, wherein the capping layer includes a repeating sequence of one or more Cr layers alternating with one or more layers of an element selected from the group consisting of Ni, Ta, Pt, Pd, Tb, Gd, W, Mo, Ru, Bi, Hf, Fe, Co, Ti, and V.

9. The method according to claim 1, wherein the pinning layer includes a hard magnetic layer.

10. The method according to claim 1, wherein each of the free layer and the reference layer includes a CoFeB layer.

11. The method according to claim 1, further comprising forming a spacer layer on the reference layer, and thereafter forming the pinning layer on the spacer layer.

12. The method according to claim 1,
   wherein annealing the capping layer comprises causing diffusion of Cr from the capping layer into at least the at least one sub-layer of the pinning layer.

13. The method according to claim 12, further comprising, subsequent to forming the free layer and before forming the reference layer, annealing to cause the free layer to crystallize.

14. The method according to claim 12, further comprising, subsequent to forming the reference layer and before forming the at least one sub-layer of the pinning layer, annealing to cause the reference layer to crystallize.

15. The method according to claim 12, wherein the at least one sub-layer of the pinning layer includes a hard magnetic layer.

* * * * *